(12) United States Patent
Frosien

(10) Patent No.: US 7,939,800 B2
(45) Date of Patent: May 10, 2011

(54) ARRANGEMENT AND METHOD FOR COMPENSATING EMITTER TIP VIBRATIONS

(75) Inventor: Juergen Frosien, Riemerling (DE)

(73) Assignee: ICT, Integrated Circuit Testing, Gesellschaft fur Halbleiterpruftechnik mbH, Heimstetten (DE)

(*) Notice: Subject to any disclaimer, the term of this patent is extended or adjusted under 35 U.S.C. 154(b) by 320 days.

(21) Appl. No.: 12/209,079

(22) Filed: Sep. 11, 2008

(65) Prior Publication Data

US 2009/0001266 A1    Jan. 1, 2009

Related U.S. Application Data

(63) Continuation-in-part of application No. 11/582,848, filed on Oct. 18, 2006, now Pat. No. 7,633,074.

(30) Foreign Application Priority Data

Oct. 19, 2005   (EP) ..................................... 05022818

(51) Int. Cl.
*H01J 37/30* (2006.01)
*G02B 21/00* (2006.01)

(52) U.S. Cl. ..... 250/306; 250/307; 250/310; 250/396 R; 250/423 P; 250/424

(58) Field of Classification Search .................. 250/306, 250/307, 310, 396 R, 423 P, 424, 492.2, 492.23
See application file for complete search history.

(56) References Cited

U.S. PATENT DOCUMENTS

| 5,831,379 A | 11/1998 | Jeong et al. |
| 7,633,074 B2 * | 12/2009 | Frosien .................... 250/492.23 |

FOREIGN PATENT DOCUMENTS

| JP | 02061951 | 3/1990 |
| JP | 07037503 | 2/1995 |
| JP | 08298088 | 11/1996 |
| JP | 09082253 | 3/1997 |
| JP | 10135114 | 5/1998 |
| JP | 2000077000 | 3/2000 |
| JP | 2001167688 | 6/2001 |

OTHER PUBLICATIONS

Extended European Search Report dated Jun. 28, 2006.
European Examination Report dated Apr. 28, 2008.

* cited by examiner

*Primary Examiner* — David A Vanore
(74) *Attorney, Agent, or Firm* — Patterson & Sheridan, L.L.P.

(57) ABSTRACT

The present invention provides a charged particle beam apparatus with a charged particle beam source including an emitter with an emitter tip; and supporting member for supporting the emitter. Further, the apparatus includes an emitter location-measuring device for repeatedly measuring the location of the emitter; and a deflector system for compensating variations in the location of the emitter.

28 Claims, 11 Drawing Sheets

PRIOR ART

PRIOR ART

ARRANGEMENT AND METHOD FOR COMPENSATING EMITTER TIP VIBRATIONS

CROSS-REFERENCE TO RELATED APPLICATION

This application is a continuation-in-part of co-pending U.S. patent application Ser. No. 11/582,848 filed on Oct. 18, 2006, which is incorporated herein by reference in its entirety.

FIELD OF THE INVENTION

The invention relates to a charged particle beam apparatus. In particular, it relates to an arrangement and a method to compensate for variations in the tip location, particularly tip vibrations of an emitter tip. More specifically, it relates to a charged particle beam apparatus as well as to a method of compensating variations in an emitter location of a charged particle beam apparatus.

BACKGROUND OF THE INVENTION

Charged particle beam apparatuses are used in a plurality of industrial fields, including, but not limited to, high resolution imaging and processing of samples, inspection of semiconductor devices during manufacturing, exposure systems for lithography, detecting devices and testing systems. There is a high demand for structuring, testing and inspecting specimens within the micrometer and nanometer scale. Micrometer and nanometer scale process control, inspection, or structuring, is often done with charged particle beams, e.g., electron beams or ion beams. Charged particle beams offer superior spatial resolution compared to, e.g., photon beams due to their short wavelengths.

Although the prior art and some embodiments of the present invention will be described in the following with reference to electrons, electron beams, electron emitters, or electron microscopes, it should be understood that the explanations are also true for other charged particles, like ions, ion beams, emitters for generating ions, etc. Hence, embodiments of a charged particle beam apparatus described herein are directed to ion beam apparatuses.

The first step in the process of creating images in any electron microscope is the production of an electron beam. The electron beam is generated in a device often called an electron gun. Three major types of electron guns are used in electron microscopes: tungsten-hairpin filament guns, lanthanum-hexaboride guns, and field-emission guns. Field-emission guns offer several advantages over tungsten-hairpin filament guns or lanthanum-hexaboride guns: First, the brightness may be up to a thousand times greater than that of a tungsten gun. Second, the electrons are emitted from a point more narrow than that in the other sources. Thus, superior resolution is achieved by field-emission guns compared to tungsten or $LaB_6$ guns. Furthermore, the energy spread of the emitted electrons is only about one-tenth that of the tungsten-hairpin gun and one-fifth that of the $LaB_6$ gun. Finally, the field-emission gun has a very long life, up to a hundred times that of a tungsten gun. For these reasons, the field-emission gun is a good choice for a number of applications.

The typical construction of a conventional electron emitter, like e.g., a thermal field-emission (TFE) gun, a cold field-emission (CFE) gun, or a field-assisted photocathode, is shown in FIGS. 9a to 9c. In FIG. 9a, the emitter assembly is mounted on an insulating ceramic base 1, which is normally a ceramic socket. A hairpin wire (support) 3 is attached to two metal support pins 2. The hairpin wire 3, which is made typically out of tungsten, can also be used as a heater in cases that the emitter requires heat for normal operation, for cleaning, for processing or for other reasons. The emitter 4 is supported by a supporting member formed by the base, the support pins and the hairpin wire (filament). Typically, the bent tungsten wire 3 is attached to support pins 2 by spot welding. The rear end 2b of the support pins are used as connection terminals. A very finely curved sharp tungsten tip serves as the emitter tip (particle beam source) 4 and is attached to the bent tungsten wire 3. Typically, the emitter tip 4a is attached to the heating filament 3 by spot welding.

However, the conventional field-emission gun shown in FIGS. 9a to 9c suffers e.g., from mechanical vibration of the emitter. Mechanical vibrations of the emitter tip significantly limit the achievable resolution. This applies to many corpuscular beam systems, but in particular to scanning particle beam systems.

The problem of mechanical vibration will be explained with reference to FIGS. 9d and 9e. FIG. 9d shows a first vibrational mode of the conventional field-emission gun shown in FIGS. 9a to 9c. In this first vibrational mode, the emitter tip 4a undergoes a displacement in the x-direction. However, the emitter configuration is stiff in the x-direction so that such a displacement in x-direction corresponds to a higher order vibrational excitation which may even include torsion movements of the heating filament 3. Accordingly, such a high order vibrational mode has a very high eigenfrequency and is strongly damped. Therefore, this first vibrational mode has only a very small amplitude and, therefore, has not yet been observed in experiments.

FIG. 9e shows a second vibrational mode of the conventional field-emission gun shown in FIGS. 9a to 9c. In this second vibrational mode, the emitter tip 4a undergoes a displacement in the y-direction. This displacement in the y-direction is caused by bending of the heating filament 3. While being stiff in the x-direction, the emitter configuration is not very stiff in the y-direction so that a bending movement of the heating filament 3 in the y-direction corresponds to a lower order vibrational mode. Typically, this second vibrational mode of the emitter has an eigenfrequency of about 2 kHz. Furthermore, the damping is not very strong so that the second vibrational mode has a considerable amplitude. In fact, this amplitude may be so large, e.g., within the nanometer range, that it can be observed in an experiment. Consequently, the displacement of the emitter tip 4a in the y-direction limits the resolution of some electron microscopes, especially for hairpin sources with an emitter needle welded on top of the hairpin, which are used in many applications like SEMs, FIBs, writing and modification tools.

In particular, the second vibrational mode can be introduced by vibrations of the system or acoustic noise. The frequencies of these vibrations are in the kHz regime and amplitudes of several nanometers can occur. The tip vibrations become resolution limiting in particle beam system with particle beam sources of small (virtual) size. One example, are cold field emitters (CFE) in electron-beam technology, which have a virtual sources size of about 3 nm. But also, ion beam technology sources with small effective diameters are known.

In the past it has been suggested to stabilize the emitter tip by adding an additional filament, that is a third wire, which may then be arranged e.g., in an angle of 90° to the filament shown in FIGS. 9a to 9e. Thereby, particularly the second vibrational mode is intended to be reduced. Such a device can increase the stability or stiffness of the arrangement to a certain degree. Nevertheless, when the tip is heated through the wire, an arrangement having more than two connections to the terminal positioned in one plane may introduce a drift due to deformation of the wires. Further, it is still difficult to guarantee a very high stability. For high resolution applications, with a resolution of 1 nanometer or below, a stability of 1 nm or below would need to be guaranteed.

SUMMARY OF THE INVENTION

One embodiment provides a charged particle beam apparatus, the apparatus including a charged particle beam source with an emitter with an emitter tip and a supporting member for supporting the emitter, an emitter location-measuring device for repeatedly measuring the location of the emitter, and at least one element selected from the group consisting of a deflector system adapted to compensate variations in the location of the emitter and a stage positioning system adapted to compensate variations in the location of the emitter; wherein the charged particle beam source is adapted to generate at least one charged particle beam, the charged particles of the at least one charged particle beam including ions.

Yet another embodiment is a method of compensating variations in an emitter location of a charged particle beam apparatus, including measuring the emitter location of a charged particle beam emitter and compensating variations in the emitter location, wherein the charged particle beam emitter is provided in a charged particle beam source, the charged particle beam source generating at least one charged particle beam, the charged particles of the at least one charged particle beam including ions.

Embodiments are also directed to apparatuses for carrying out the disclosed methods and including apparatus parts for performing each described method. These methods may be performed by way of hardware components, a computer programmed by appropriate software, by any combination of the two or in any other manner. Furthermore, embodiments are also directed to methods by which the described apparatus operates. Embodiments include carrying out every function of the apparatus or manufacturing every part of the apparatus.

BRIEF DESCRIPTION OF THE DRAWINGS

Some of the above indicated and other more detailed embodiments will be described in the following description and partially illustrated with reference to the figures. Therein:

FIG. 1b shows another side view of the embodiment shown in FIG. 1a;

FIG. 2b shows another side view of the embodiment shown in FIG. 2a;

FIG. 9b shows a side view of the prior art emitter shown in FIG. 9a;

FIG. 9c shows a plan top view of the prior art emitter shown in FIG. 9a;

FIG. 9d shows a first vibrational mode of the prior art emitter shown in FIG. 9a;

FIG. 9e shows a second vibrational mode of the prior art emitter shown in FIG. 9a;

DETAILED DESCRIPTION OF THE DRAWINGS

It should be understood from the above description of the present invention that the emitter configuration according to the embodiments of the present invention simultaneously provides improved resolution due to compensation of variations in the location of the (virtual) emitter source. Further, variations in the relative position of the stage with respect to the charged particle beam column may be compensated for and emission stability may be provided.

Generally, references to vibrations of the emitter and/or the stage should be understood as an explanation of variations of the location of the emitter and/or stage. Nevertheless, vibrations are one kind of variation of the location of the emitter and/or the stage that may be particularly considerable. Other variations of the location can be introduced due to thermal drift, misalignment or insufficient positioning of movable components.

Generally, the material for the tungsten hairpin wires and for the emitter tips, as described herein, is tungsten. However, independent of specific embodiments, the hairpin wire may also include tantalum or other suitable materials. Further, the emitter tip, which is often described as being a tungsten emitter tip, may also be made of other materials like carbon, diamond, tantalum and the like. The emitter tip may typically be a single crystal or an amorphous.

Figure 1A:
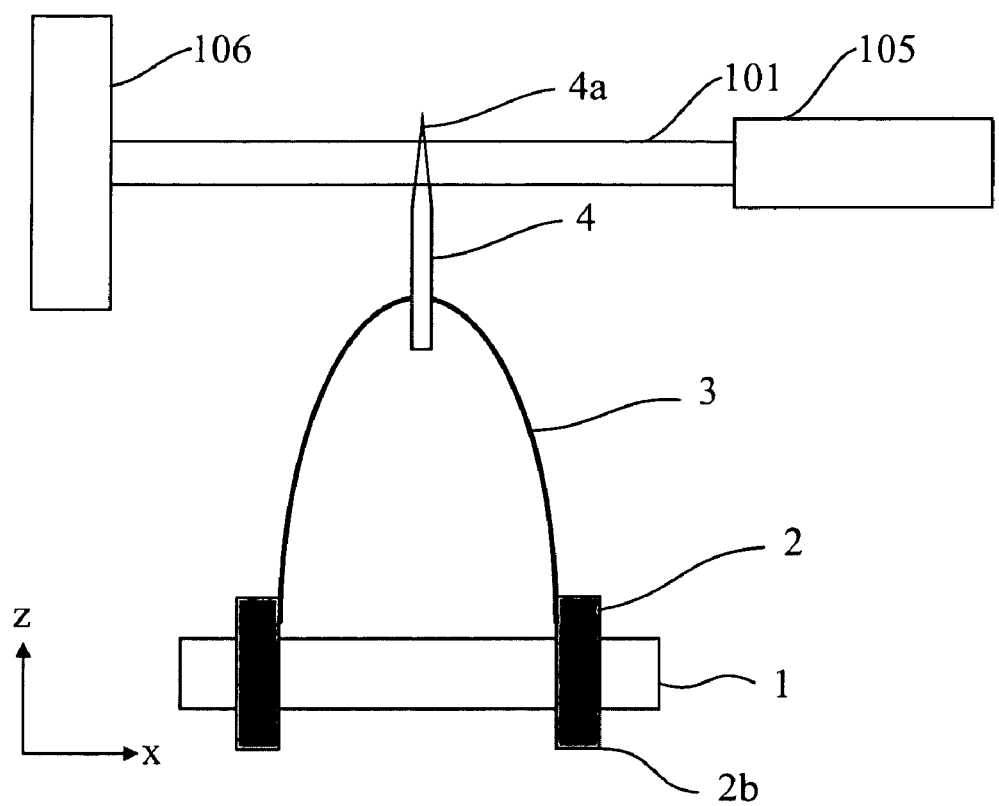
FIG. 1a shows a side view of an emitter and an emitter location-measuring system.
Figure 1B:
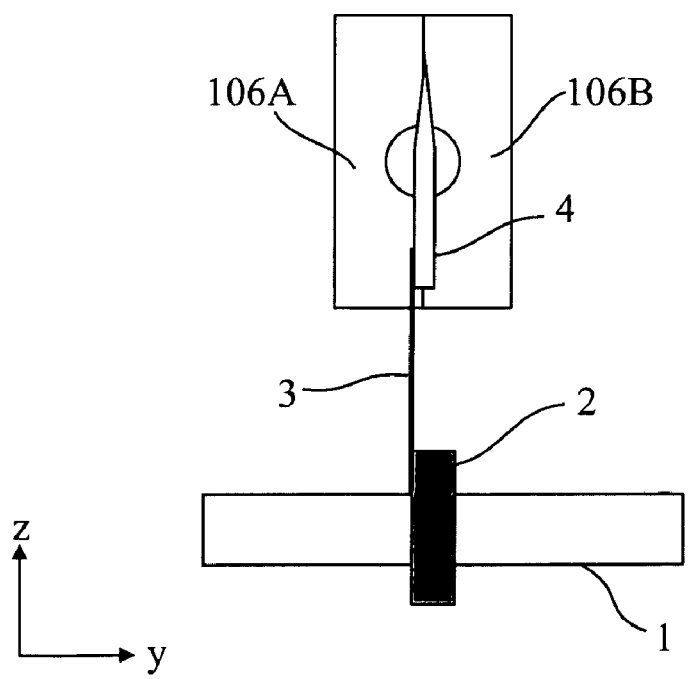

FIGS. 1a and 1b show a first embodiment according to the present invention. FIG. 1a is a side view in the z-x-direction. FIG. 1b is a side view in the z-y-direction. An emitter configuration for an electron beam apparatus is shown. Emitter needle 4 with emitter tip and filament 3 are supported by a ceramic base 1. To form the filament 3, the wire, which may include tungsten, tantalum or other suitable materials, is bent into the loop and the free ends of the loop are attached to the first and second support pins 2 by spot welding. The support pins 2 are made of metal and extend through the ceramic base 1 so that electrical contact can be made to the filament 3 via the support pins 2. An emitter tip 4a made of the tungsten crystal which has been formed into a very sharp tip is typically spot welded to the filament. It can be seen that a base 1, which is typically a ceramic socket holds a support wire 3 via support pins 2.

The hairpin wire (support) 3 is attached to two metal support pins 2. As the hairpin wire 3 is typically made out of tungsten, tantalum or other suitable materials, it can also be used as a heater in cases that the emitter requires heat for normal operation, for cleaning or for other reasons. The rear ends 2b of the support pins 2 are used as connection terminals for control of the emission source. A very finely curved sharp tungsten tip serves as the emitter tip (particle beam source) 4a and is attached to the bent tungsten wire 3. Typically, the emitter 4 is attached to the heating filament 3 by spot welding.

Figure 9A:
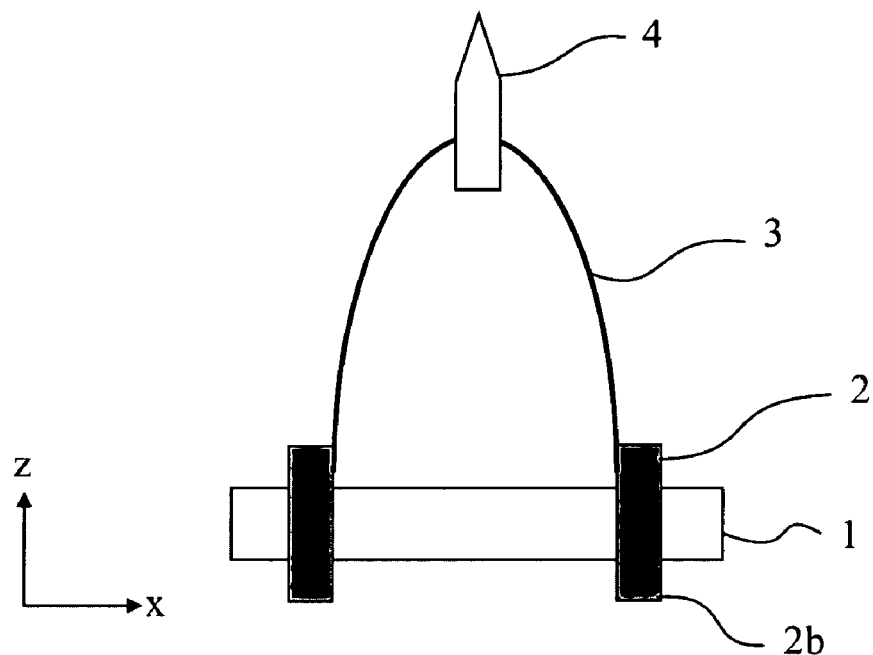
FIG. 9a shows a front view of an emitter according to the prior art.
Figure 9B:
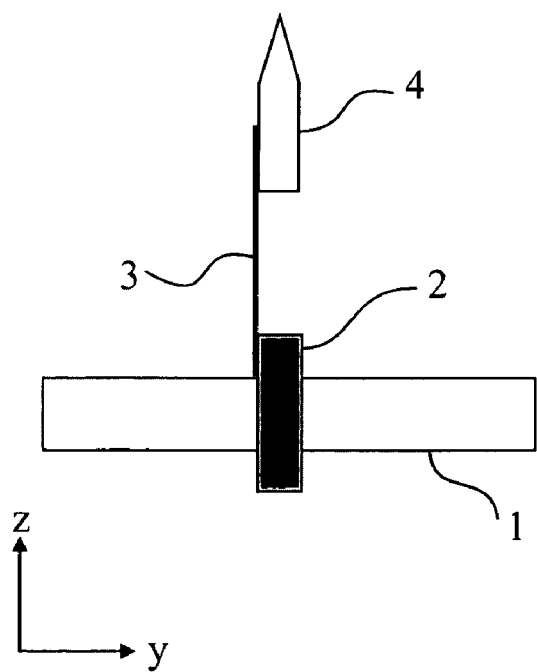
Figure 9C:
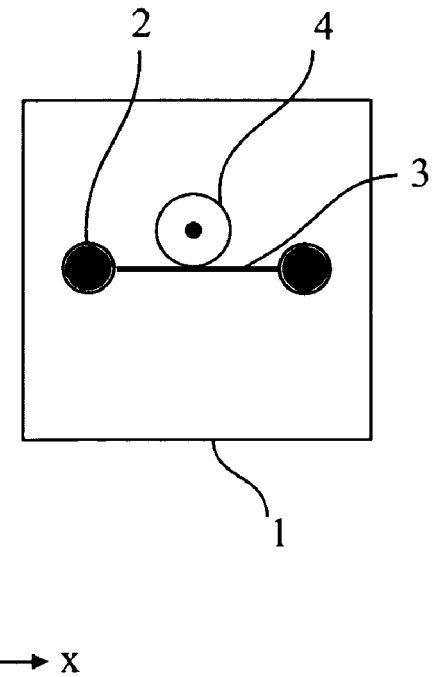
Figure 9D:
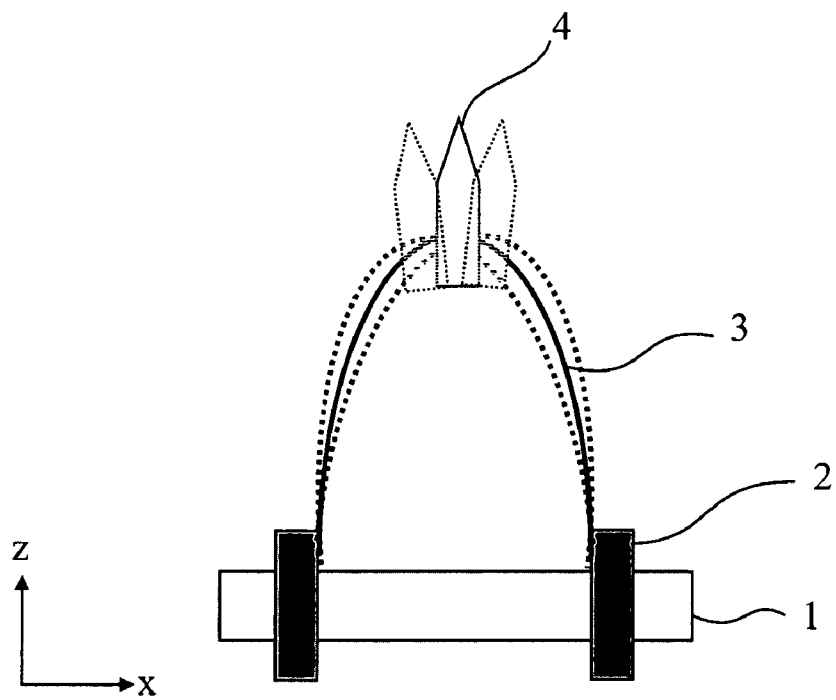
Figure 9E:
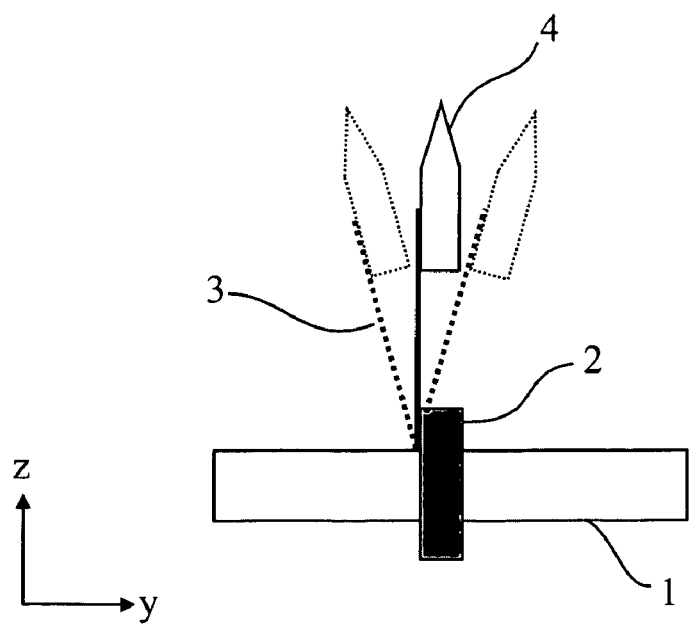

Because of the mechanical design, this device is sensitive to tip vibrations, in particular in the vibrational mode shown in FIG. 9e. Nevertheless, the design also has benefits, such as easy and low-cost setup, insensitivity to temperature drift, good thermal isolation from the needle to the base, and the like. For example, a temperature drift will only cause a movement in the z-direction, which can be compensated by adjusting the imaging properties of the lens or the lenses in the column.

In view of the above, in the first instance, it is not intended to provide a stable mechanical design, which also provides the other benefits. In the first instance, it is rather proposed to measure the tip vibrations and compensate for the measured vibrations.

The vibrations of the tip are measured. The movement of the emission source resulting from the vibrations is then compensated by compensating means arranged in the charged particle beam path. These compensating means can be arranged between the source and the specimen. Such compensating means, which may e.g., be deflectors in single stage, double stage or even higher stage arrangements, are adapted to change the bam path such that it seems that the emitter location would move, when seen from the specimen side of the charged particle optics. The compensation means, e.g., in the form of a deflector system, will be described in more detail below.

The embodiment of FIGS. 1a and 1b shows an example of a contact-less measurement of the tip vibrations. Generally, without being limiting to this embodiment, contact-less measurement principles for measuring the tip vibrations are typically used.

A light source 105, which may be a laser, emits a light beam 101. The light beam 101 is shaped to be a collimated beam. The light beam hits parts of the emitter needle and/or the emitter tip. Alternatively or additionally, according to other embodiments (not shown), the light beam may also hit parts of the filament 3. Thereby, parts of the light beam are blocked by the emitter. The rest of the emitted light is detected with detector 106. The laser and the detector provide an emitter location-measuring device. Detector 106 is a segmented array with e.g., two segments 106A and 106B. The "shadow" of the emitter which is projected onto the detector results in a difference of the signals from segment 106A and 106B depending on variation of the tip location. Thus, a vibration of the tip in the y-direction can be determined based on the intensities measured by the segments of the detector.

Generally, it may be preferred to use a laser beam as the light beam. The short bandwidth improves optical imaging of the light beam and therefore simplifies the measurement of e.g., the signal difference between segments 106A and 106B. Further, some measuring arrangements, which may be applied, require the coherence of the laser to conduct the measurement. This might for example be an interferometer that can also be used for measuring the amount and the frequency of the tip vibrations.

Figure 2A:
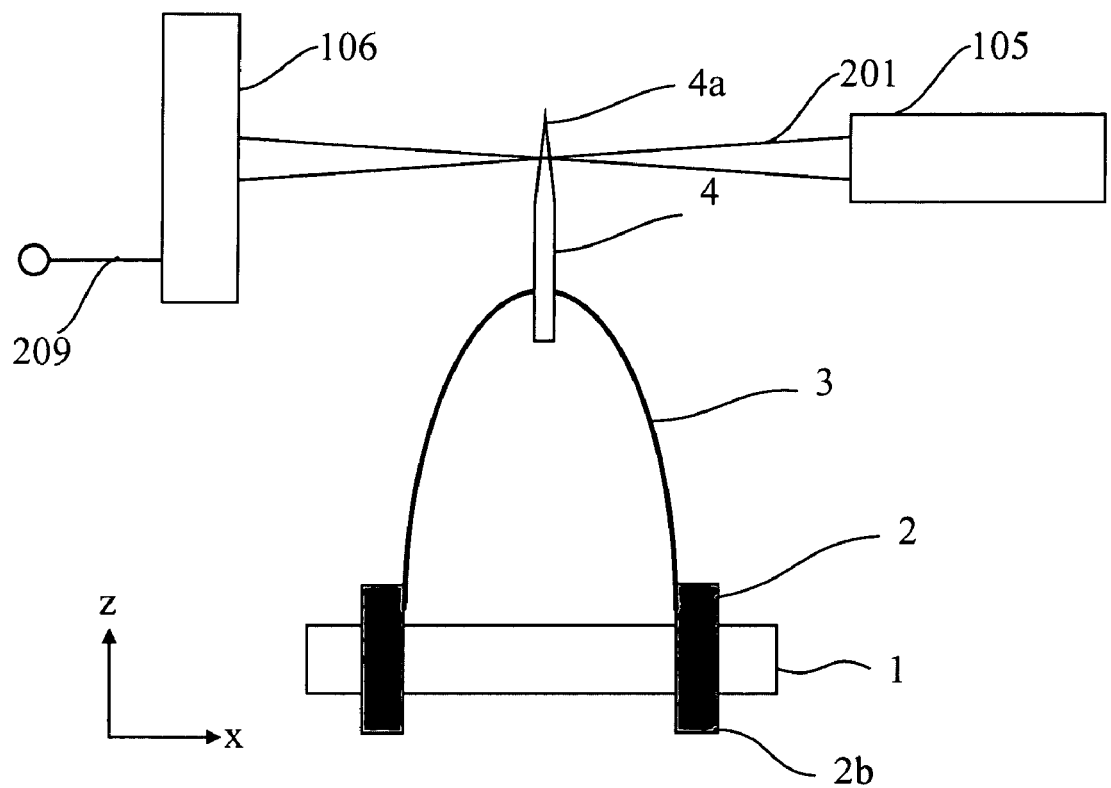
FIG. 2a shows a side view of another embodiment of an emitter and an emitter location-measuring system.
Figure 2B:
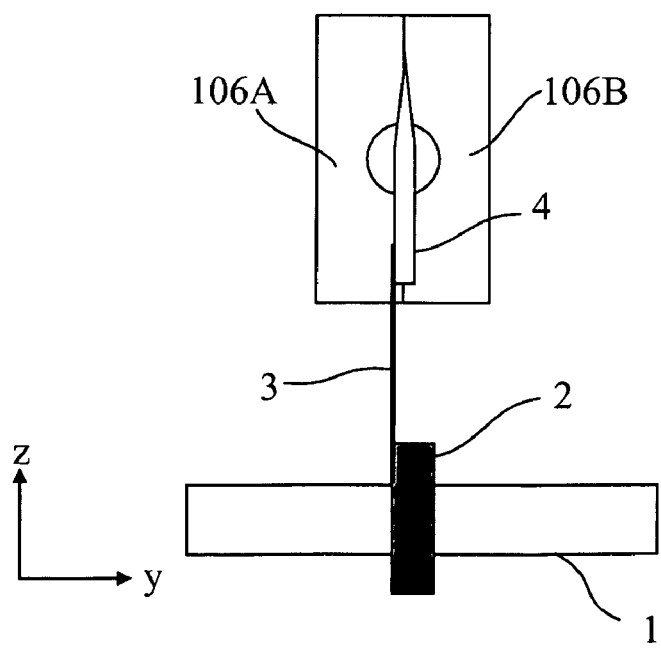

FIGS. 2a and 2b show a further embodiment, which is fairly similar to the embodiment shown with respect to FIGS. 1a and 1b. FIG. 1a is a side view in the z-x-direction. FIG. 1b is a side view in the z-y-direction. However, within the embodiment of FIGS. 2a and 2b, the light beam 201 is a focused light beam. The focus of the light beam is at the position or close to the position of the emitter. On the one hand, depending on the momentary position of the emitter with regard to a vibrational cycle, the light beam is blocked to a larger extent. On the other hand, more intensity may pass the light beam if the emitter swings away from the focused light beam. Thus, the signal intensity difference between segments 106A and 106B may be increased by focusing the light beam.

If the emitter needle is positioned at the position of the focus, the light beam might be blocked for both segments 106A and 106B of detector 106. This may result in reduced sensitivity for emitter positions with entirely blocked light beam. Thus, the focus might be positioned e.g., about 1 to about 5 mm before or behind the location of the needle in x-direction. By adjusting the distance of the focus from the measuring position (needle or wire), the size of the shadow and the differences in intensity may be adjusted.

If the emitter tip were imaged onto a detector array to, thereby, measure the vibration of the tip, the resolution of the measurement would be limited to be within the order of the wavelength of the light beam. Using UV light might thereby increase the resolution. However, a measurement in the nanometer range will not be possible by merely imaging the emitter tip and following the image of the tip. Therefore, other signals than the image on a camera has to be used.

One example to measure the vibration of the emitter tip within the nanometer range and in a range up to several 100 kHz is the measurement of the intensity on different segments, as described above with respect to segments 106A and 106B.

Further, it would be possible to use reflected light, as will be described with respect to another embodiment below. Generally, the intensity distribution of reflected light or of light passing by an obstacle is highly sensitive to the distance of the obstacle from e.g., the entrance of a fiber optics. If, e.g., in one multi-fiber a first half of the fibers are used to provide laser light to an obstacle, (e.g., the emitter tip) and the rest of the fibers are used to collect the reflected light, a vibrational detector with a resolution in the nanometer range and a frequency response in the several 100 kHz range can be realized.

Alternatively, for transmitted light, two multi-fibers may be used to provide a light curtain. Thereby, a plurality of emitting fibers is provided on one side of the emitter needle and a plurality of receiving fibers are provided on the other side of the emitter needle. In between, the emitter and/or the filament as an obstacle block the light of some fibers. The light of other fibers is not blocked. Thus, the summed up intensity can be used as a measure of how far the emitter reaches into the light curtain. The above measurements and especially combinations thereof allow for vibrational detectors with a resolution in the range of Angstroms and a frequency response of up to several 100 kHz.

These effects described in detail with regard to multi-fiber optics, may also be utilized with other optical systems. Generally, the intensity of the transmitted and/or reflected light is used as an indicator of the emitter needle/tip location in the light beam path. Other effects, like the Doppler-Effect may also be used or combined with the different kind of measurements described above.

For example, according to another embodiment (not shown), it is also possible to use an emitter location-measuring device in the form of an interferometer in order to measure the vibration of the emitter tip. Thereby, a mirror is positioned along the direction of the vibration to be measured. The mirror can be attached either to the emitter needle or to the hairpin wire. Alternatively, it is possible to provide a flat within the emitter needle that acts as a mirror. An interferometer using for example a He—Ne-laser would then be capable of measuring the vibrations of e.g., the second vibrational mode with a resolution of about 0.1 nm at a frequency of about 500 kHz.

With respect to the above-described embodiment, which utilizes an interferometer, a second laser beam might be directed to the housing of the gun, that is the housing of the emitter, to provide a reference of the measured emitter location variations relative to the gun housing. Thereby, particular drifts of the emitter tip and/or the emitter configuration including the ceramic base and the filament may be measured. These drifts can, thereby, be determined relative to the gun housing, in which the emitter configuration is positioned.

According to another embodiment (not shown), an interferometer system can be provided including two interferometer axis. One axis may be oriented along a first direction (e.g., y-direction) and one axis along a second direction (e.g., x-direction), which is essentially perpendicular to the first direction.

Figure 3:
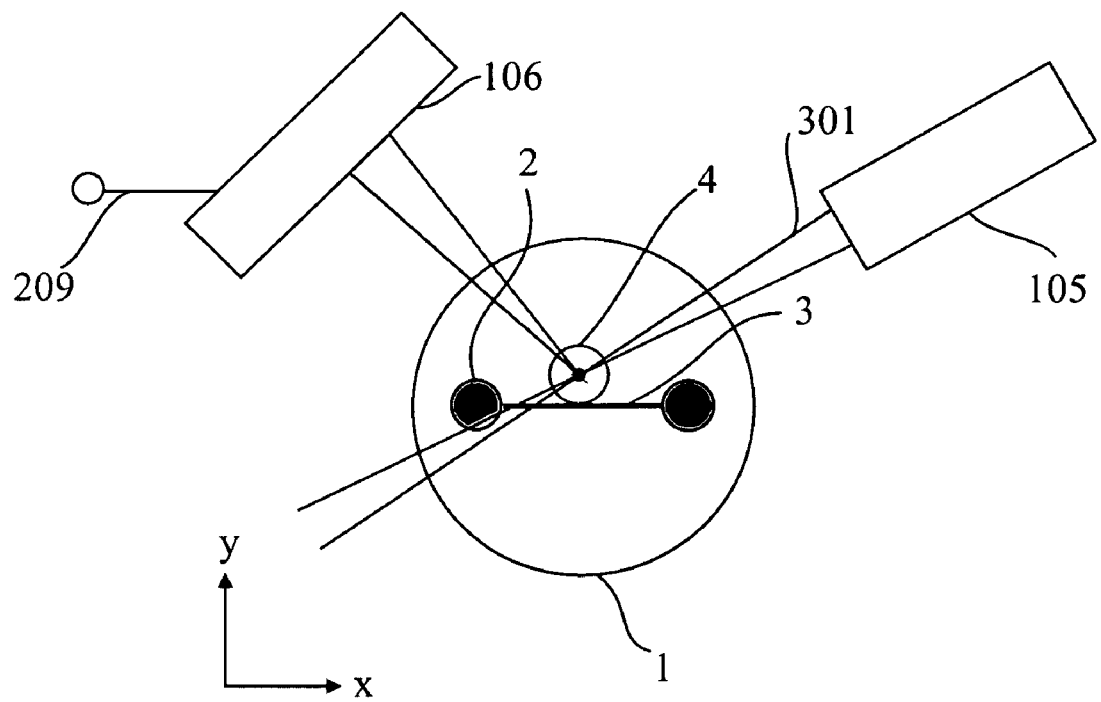
FIG. 3 shows a top view of a further embodiment including an emitter and an emitter location-measuring system.

An arrangement describing a measurement with reflected light is e.g., shown in FIG. 3. The light beam 301, which can either be focused or collimated, and which is emitted by laser 105, is guided onto the emitter or the hairpin. Upon vibration of the emitter, the light intensity and light direction which is reflected to detector 106 changes. Detector 106 is a segmented array with e.g., two segments. If vibrations occur, the light guided onto the detector results in a difference of the signals from the individual segments. Thus, a vibration of the tip in the x- and/or y-direction can be determined based on the intensities measured by the segments of the detector. The position of the emitter or the vibrational amplitude and frequency, respectively, can be measured. A corresponding signal is then outputted to signal output 209. In order to improve the reflection properties of the hairpin or the needle or to adapt the reflection (to provide more accurate measurement results), a flat, which acts as a mirror, can be provided. The flat can be formed either in the needle or in the hairpin or it can be attached to the needle or hairpin.

In the above-mentioned embodiments, either the hairpin or the source needle can be used as a measurement point. Generally, the movement of the tip end is to be compensated for. More precisely, a variation of the location of the virtual point of emission of the emitter tip should be corrected.

Figure 11:
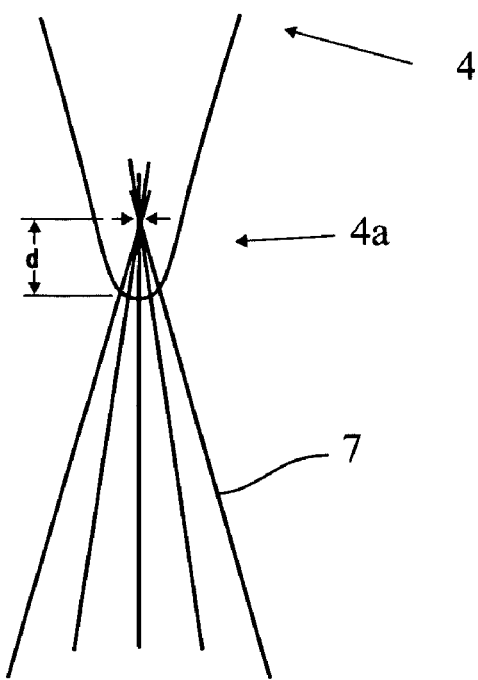
FIG. 11 shows a schematic drawing for explaining the virtual emitter source.

This might be better understood with reference to FIG. 11. FIG. 11 shows the tip 4a of an emitter 4. Beams 7 are released from the emitter as indicated by the rays shown. These rays have a virtual emission source that is located at a distance d from the very tip end of emitter tip 4a. The virtual emission source is located within the emitter tip.

In view of the above, a measurement point close to the emitter tip, at which the vibration is measured, provides a result that better correlates to the movement of the emitter tip. In the case that the vibration of the hairpin or a bottom part of the needle is measured, the measurement results may be transformed to a movement of the tip end of the emitter needle.

Figure 4:
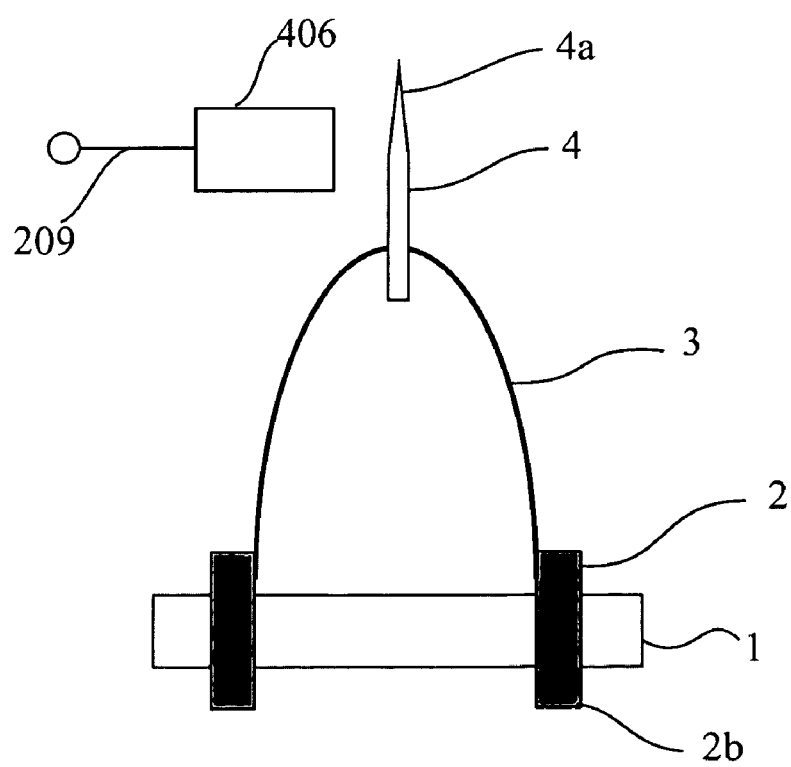
FIG. 4 shows a side view of another embodiment of an emitter and a measuring system.

According to a further embodiment, also other measuring devices can be used. FIG. 4 shows a capacitive or inductive distance-measuring device 406 as an emitter location-measuring device. A signal indicative of the amplitude of the vibration and the frequency will be outputted by signal output 209.

A further embodiment will now be described with respect to FIG. 5a. Therein, the measuring system which is shown in FIG. 3, including the laser 105 and the detector 106, is used. An emitter configuration for an electron beam apparatus is shown. Emitter needle 4 with emitter tip and filament 3 are supported by a ceramic base 1. To form the filament 3, the tungsten wire is bent into the loop and the free ends of the loop are attached to the first and second support pins 2 by spot welding. Instead of tungsten also tantalum (e.g., for ion source) or other suitable materials may be used. The support pins 2 are made of metal and extend through the ceramic base 1 so that electrical contact can be made to the filament 3 via the support pins 2. An emitter 4 made of the tungsten crystal which has been formed into a very sharp tip is typically spot welded to the filament. It can be seen that a base 1, which is typically a ceramic socket holds a support wire 3 via support pins 2.

The hairpin wire (support) 3 is attached to two metal support pins 2. A third support pin 5 is provided. Like the first and the second support pins 2, also this third support pin 5 is made of metal and extends through the ceramic base 1. Alternatively, the third support pin may not extend through the base but it provided in the form of a stabilization point on the base. A stabilization element 6 is attached to the third support pin 5 and to the filament 3 adjacent to the emitter tip. Typically, this stabilization element 6 is formed of tungsten wire like the filament 3 and is spot welded to the third support pin 5 and the filament 3. However, it is also possible that stabilization element 6 merely abuts against the filament in a resilient manner. Thereby, vibrations of filament 3 are reduced due to the spring forces of the stabilization element 6 acting on filament 3. Alternatively, the stabilization element 6 can be formed of other materials or it can be integrally formed with the emitter tip.

Figure 5A:
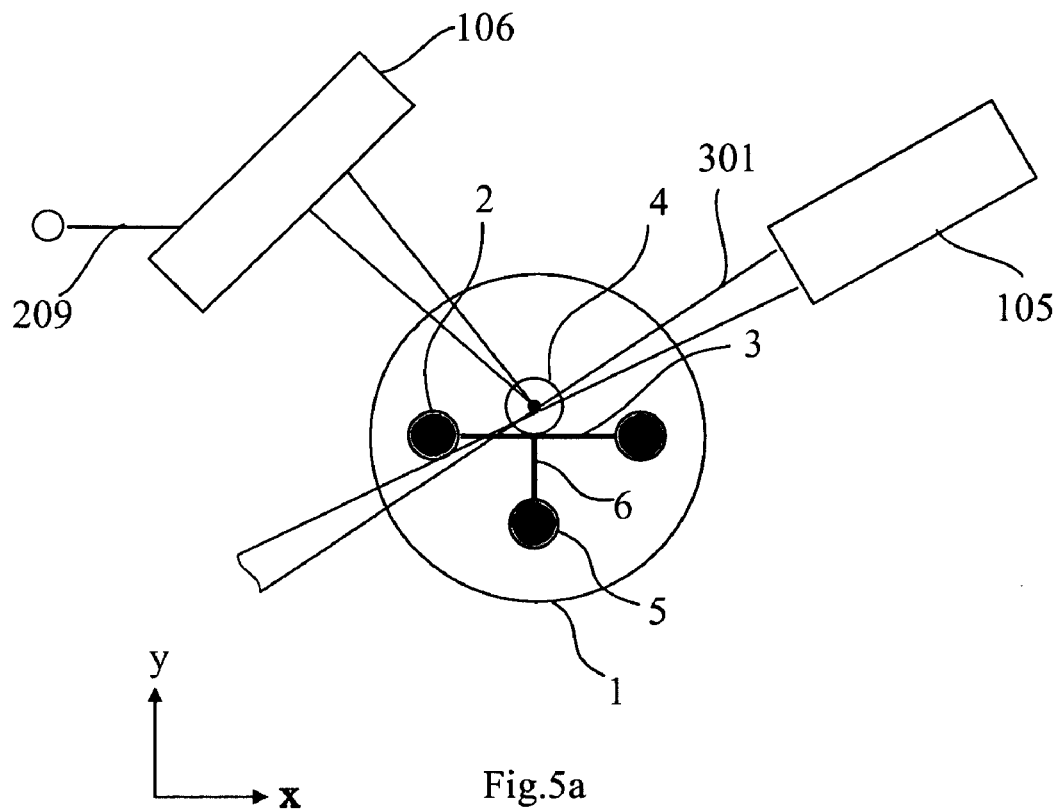
FIG. 5a shows a top view of a further embodiment including an amended emitter and an emitter location-measuring system.

The emitter configuration shown in FIG. 5a can reduce vibrations of the emitter tip of emitter needle 4. In FIG. 5a, these reduced vibrations are measured by the optical measuring system including laser 105 forming focused light beam 301. The reflected light is detected similarly to the embodiments shown in FIG. 3 by detector 106.

Stabilizing the emitter tip as described with respect to FIG. 5a can be applied to all embodiments described above. The stabilization can be used independently of the measurement arrangement for detecting the position of the emitter tip.

A further embodiment will now be described with respect to FIG. 5b. Within FIG. 5b, a similar system as in FIGS. 2a and 2b is shown. Within the embodiment of FIG. 5b, the light beams 201x and 201y are focused light beams.

Two light beam sources 105x and 105y are provided and two segmented detectors 106x and 106y are provided. Thereby, a variation in the location of the emitter tip along the x-direction, e.g., a vibrational mode as shown in FIG. 9d, and a variation of the emitter tip along the y-direction, e.g., a vibrational mode as shown in FIG. 9e, can be measured by two independent units. The variations in the x-direction and the y-direction are both measured. In the embodiment of FIG. 5b, two measurement results are outputted to signal outputs 209x and 209y. Alternatively, a combined x-y-measurement may be conducted by an x-y-measurement unit and one signal, indicative of x-displacements and y-displacement may be provided by a signal output.

Independent of specific embodiments, a measurement in x-direction and y-direction to measure variations in the location of the emitter tip in x-direction and in y-direction may be used for all emitter location-measuring devices and all charged particle beam apparatuses disclosed herein. Thereby, typically a second measuring assembly is included in the measuring device.

Figure 5B:
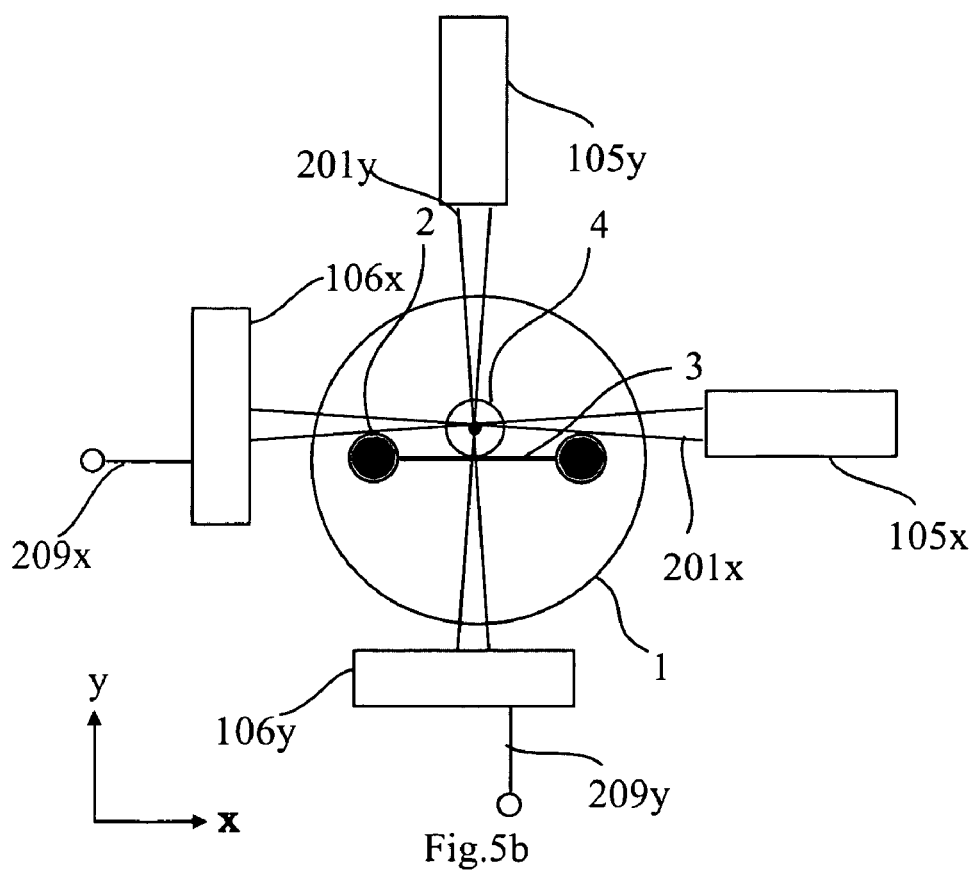
FIG. 5b shows a top view of a further embodiment of an emitter and a measuring system.

Within FIG. 5b, the focus of the light beam is at the position or close to the position of the emitter. On the one hand, depending on the momentary position of the emitter with regard to a vibrational cycle, the light beam is blocked to a larger extent. On the other hand, more intensity may pass the light beam if the emitter swings away from the focused light beam. Thus, the signal intensity difference between segments 106A and 106B may be increased by focusing the light beam.

If the emitter needle is positioned at the position of the focus, the light beam might be blocked for both segments 106A and 106B of detector 106. This may result in reduced sensitivity for emitter positions with entirely blocked light beam. Thus, the focus might be positioned e.g., about 1 to about 5 mm before or behind the location of the needle in x-direction. By adjusting the distance of the focus from the measuring position (needle or wire), the size of the shadow and the differences in intensity may be adjusted.

The above-described embodiments for measuring the source location, filament location or emitter location result in an emitter location signal $S_{location}$. A suitable calibration device generates a correction signal $S_{correction}$ from this location signal. The correction signal drives a deflection arrangement, that is a correction deflector of a deflector system. The deflection arrangement compensates for the movement of the tip/source with nanometer precision or below. The calibration device takes into account for example the distance of the emitter tip with respect to the position on which the location signal has been measured.

Generally, for measurement principles based on segmented detectors, a detector array with a higher number of segments may be used. For example, a 2×2, 4×4, or detectors with up to several thousand (e.g., 4096) segments may be used.

Generally, all optical measurements described herein may be conducted by lens optics, whereby lenses are used for focusing, collimating, projecting or imaging a light beam, particularly a laser beam. Alternatively, or in combination, fiber optics may be used to guide the light beam to and from the emitter and/or the support wire. Thereby, it may especially be useful to utilize a multiple fiber to guide the light beams to and from the emitter. This will be explained in more detail below.

Without being limited to one of the embodiments, the measuring arrangements described herein are used for measuring the location of the tip and as one example therefore the vibration of the tip. A general variation in the location may— besides vibrations—also be introduced due to misalignment or a drift of the emitter tip that can be introduced by temperature changes or the like.

Figure 6A:
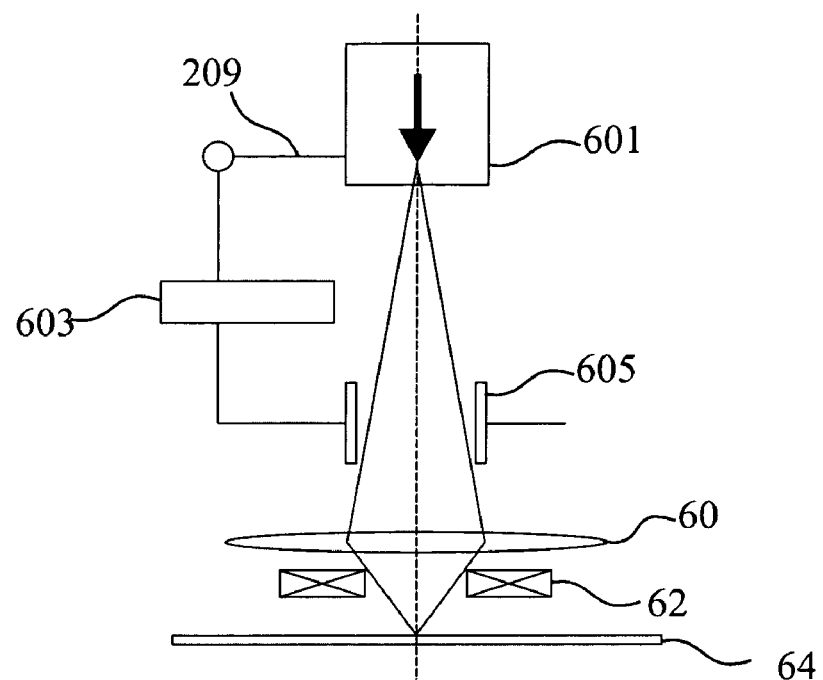
FIG. 6a shows a schematic drawing of a charged particle beam apparatus including a measuring system and a vibration compensation deflector system.
Figure 6B:
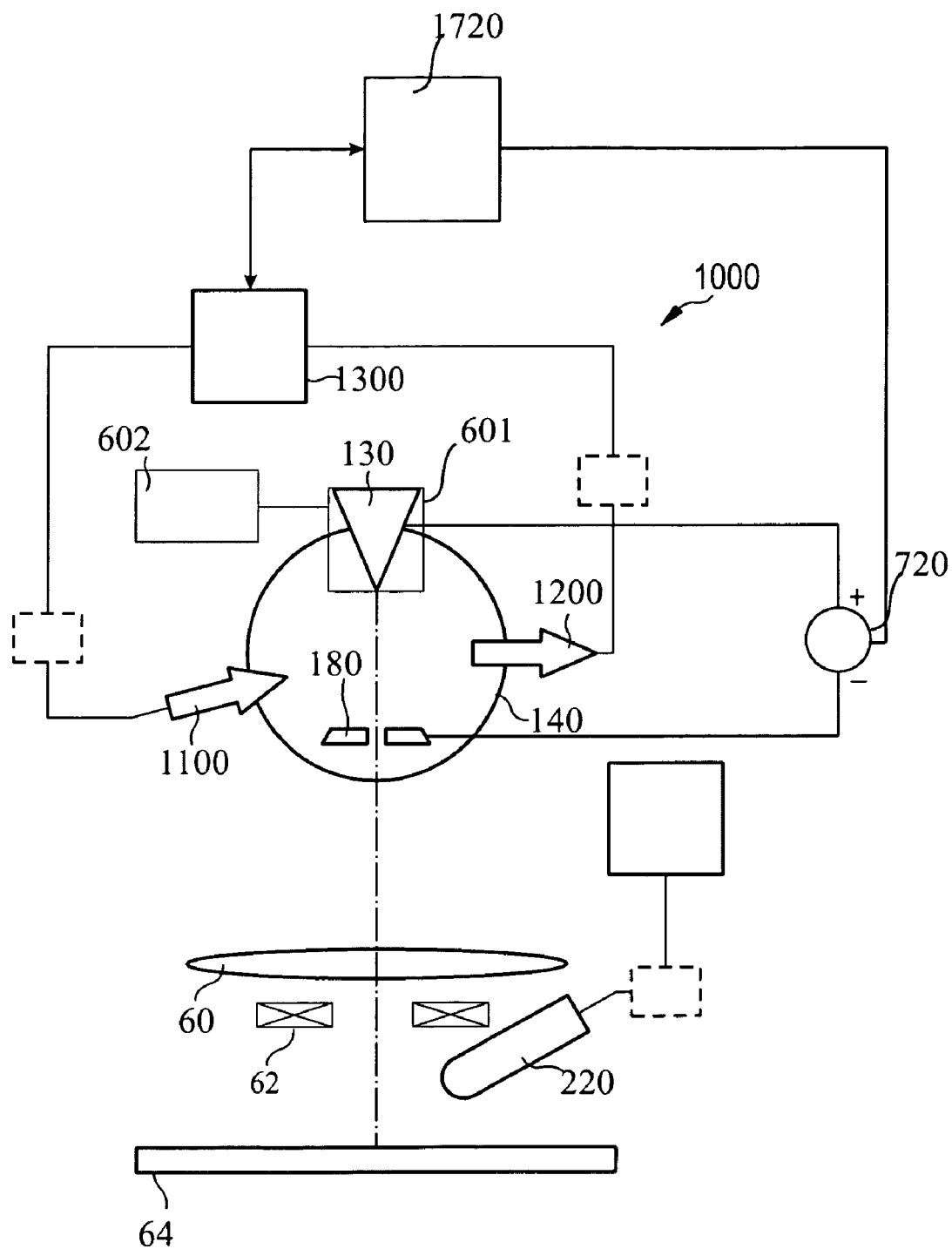
FIG. 6b shows a schematic view of a focused ion beam device which may include a charged particle beam apparatus including a measuring system and a vibration compensation deflector system according to embodiments described herein.

The deflection arrangements will now be described with respect to FIGS. 6a, 7 and 8. FIG. 6a shows a charged particle beam apparatus, which emits for example electrons. However, also ions could be produced in the charged particle beam apparatus, for instance in a gas field ion source as shown in FIG. 6b.

In the charged particle beam apparatus as illustrated in FIG. 6a, the source arrangement 601 includes the emitter tip and the emitter location-measuring device, as described above. The charged particle beam generated or emitted, respectively, by the source is focused onto specimen 64 by objective lens 60. Scan system 62, which is exemplarily shown as a magnetic deflection system including deflection coils, scans the charged particle beam over specimen 64.

The emitter location signal or source location signal $S_{location}$ is fed from signal output 209 to the calibration amplifier 603 generating the correction signal $S_{correction}$ from the emitter location signal. The correction signal is provided to the correction deflectors 605. Within FIG. 6a, these deflectors of the deflector system are shown as electrostatic deflectors. However, the correction deflectors of the deflector system can also be magnetic or combined magnetic-electrostatic. FIG. 6a shows a single stage correction deflector system, which typically may be capable of deflecting the beam in x-director and y-direction. Alternatively, a two-stage or the three-stage deflector system may be used as a correction deflection system. The correction deflectors in the system deflect the charged particle beam according to the correction signal, which has been generated to compensate for the measured variations of the tip/source location. Thus, the vibrations of the emitter tip can be compensated by deflecting the beam with correction deflectors 605 of a deflector system.

The deflector system may include electrostatic, magnetic or combined magnetic-electrostatic deflectors. It may be a single-stage, double-stage or even higher order stage system. Further, other compensation means and/or other means for deflecting the charged particle beam with respect to the specimen and thereby compensating variations in the location of the virtual emission source can be applied. As one example, the sample may be retained on a piezo-table adapted to precisely move the sample in x-direction and y-direction. Thereby, the variations in the relative position of the charged particle beam and the sample may also be compensated for. As another example, the deflection for compensating variations of the emitter location can also be added to the scan deflector system. Thus, the scan unit acts as a scanning unit and as a deflector system for compensation of variations of the emitter location.

FIG. 6b illustrates an embodiment of a focused ion beam device 1000, which may include the deflection arrangements of embodiments described herein.

Generally, focused ion beam devices can, for example, be based on liquid-metal ion sources or gas ion sources. Ions in gas ion sources can be produced by bombardment of electrons, atoms or ions with gas atoms or molecules or by exposing gas atoms or molecules to high electric fields or irradiation. Thereby, gas ion sources have been found to be potential candidates for focused ion beam FIB applications. Sources based on the field ionization process are known as gas field ion sources (GFIS). An ionization process takes place at high electric fields larger than $10^{10}$ V/m. The field may, for example, be applied between an emitter tip and a biased extraction aperture.

The emitter tip included in an emitter unit of a gas field ion source is biased to a positive potential with respect to a downstream extraction aperture, whereby an electric field strong enough to ionize the gas atoms in the vicinity of the tip of the emitter unit is generated. The area in the vicinity of the emitter, wherein the desired electric field is provided or more generally, wherein the generation of ions is conducted, may be referred to as an emitter region. Gas pressures of $10^{-6}$ mbar to $10^{-2}$ mbar are desirable near the tip of the emitter unit during the operation mode. Thereby, a gas gradient is typically used in order to, on the one hand, provide a sufficient amount of gas atoms or molecules in the emitter area and, on the other hand, to not disturb generated ions by gas molecules provided in the gun chamber during operation.

One embodiment of a focused ion beam device may include an ion beam column including a region for housing a gas field ion source emitter with an emitter area for generating ions; an electrode for extracting ions from the gas field ion source emitter; one or more gas inlets adapted to introduce a gas to the emitter area; an objective lens for focusing the ion beam generated from the gas; and a voltage supply for providing a voltage between the electrode and the gas field ion source emitter.

FIG. 6b shows a schematic view of a focused ion beam device 1000, according to some embodiments, which includes a gas field ion source and a detector 220. A gas inlet 1100 to supply gas into an emitter tip region 140 shown schematically in FIG. 6b is provided. According to some embodiments, a gas outlet 1200 to remove gas from the emitter tip region 140 can be provided. According to some embodiments, the gas outlet may be provided in form of a connection to a vacuum pump or a connection to another region or chamber. The focused ion beam device may further include an enclosure for housing a gas field ion source emitter with an emitter region for generating ions. According to different examples, the emitter tip region 140 is a chamber or an enclosure that surrounds the emitter tip 130 partially or completely. In other examples, the emitter tip region 140 may be a cap surrounding the emitter tip and having an ion beam aperture.

In operation, a focused ion beam including gas ions is generated at or near the emitter tip 130. The gas ions are generated from a gas being in the emitter tip region 140 at a partial pressure. The term "partial pressure" is used when talking about gas mixtures. Partial pressure is to be understood as the pressure of one gas in a mixture of gases.

According to some embodiments of the gas field ion source, helium can be used as a gas. According to another embodiment, other gases such as hydrogen, methane, argon or neon can be used. Furthermore, an outlet 1200 can be connected to a vacuum pump, a further vacuum chamber, or other means to support the control of the pressure in the emitter tip region 140. Thereby, the process parameters for ion beam generation can be controlled.

According to some embodiments of a gas field ion source, an adjustable power supply 720 can be provided for supplying an extraction voltage between the emitter tip 130 and an electrode 180. The extraction voltage can be controlled by a controller 1720. Further, the controller 1720 may optionally also control a controller 1300 for controlling the partial pressures of the gases.

According to one embodiment of a charged particle beam apparatus, a cooling unit may be connected to the source arrangement and emitter tip, respectively. In order to achieve a high ion yield in a GFIS, it is useful if the emitter electrodes are cooled to a low, e.g., to a cryogenic, temperature. Hence, e.g., in the gas field ion source shown in FIG. 6b, a cooling unit 602 may be connected to the source arrangement 601 and emitter tip, respectively. For instance, the cooling unit may include a cooling finger linked to the emitter tip. According to further embodiments, the cooling unit can include any of the following systems: The cooling unit may be a cryo-cooler, e.g, open or closed cycle coolers, open or closed cycle Helium coolers, open or closed cycle nitrogen coolers, a combination thereof or another cooler. Particular examples can be pulse tube coolers or GM cooler (Gifford McMahon cooler). Thereby, the emitter tip may be cooled for condensing the gas to be ionized on or near the emitter tip. Cooling the tip typically results in a higher residence time of the gas particles on or in the vicinity of the emitter tip and, hence, to a higher ionization rate. Depending on the ion species to be generated and depending on ion beam performance, e.g., emission current, the emitter tip may be cooled to temperatures in the range of about 10 K to about 100 K. Cooling of the emitter unit and the emitter tip, respectively, by operating a cooling unit, such as described above, may sometimes result in mechanical vibrations. It is desired to compensate especially vibrations of an emitter tip having a small size, e.g an emitter tip of a GFIS, which has a small virtual source size. Such vibrations of the emitter tip may be compensated using embodiments disclosed herein.

A deflection arrangement (not shown in FIG. 6b) of embodiments described herein may be included in the example of a gas field ion source schematically shown in FIG. 6b inside the emitter tip region 140 of the gas field ion source. Alternatively, the correction deflectors of a deflection arrangement described herein may be positioned outside the emitter tip region 140. For instance the correction deflectors 605 of the deflection arrangement illustrated in FIG. 6a may be provided between source arrangement 601 and electrode 180. In another example, the correction deflectors of a deflection arrangement of embodiments described herein, e.g., correction deflectors 605 of the deflection arrangement illustrated in FIG. 6a, may be provided outside the emitter tip region 140 between emitter tip region 140 and lens 60, e.g., between electrode 180 and lens 60.

For creating electron or charged particle beams, in some embodiments, ultra sharp tips may be utilized in the charged particle beam apparatus, e.g., for instance in electron or ion source applications, including, but not limited to, high resolution electron beams or gas field ion microscopes. Some ultra sharp tips may even have an apex formed of a single atom, and are referred to as single-atom tips (SAT). One known process to prepare ultra sharp tips or single atom tips is based on adsorbate induced faceting of tips, for instance of metal tips. Such ultra sharp metal tips may typically be base tips covered with a thin coating of a metal other than the metal of the base tip. For example, some known ultra sharp tips are tungsten tips covered with a thin layer of noble metal materials, e.g., Pt, Rh, Pd, and Ir. Hence, in one embodiment of the gas field ion source, the emitter tip includes an ultra sharp tip.

According to another embodiment of the charged particle beam apparatus, e.g., of the gas field ion source, the emitter unit may include a sharp supertip on an emitter tip. A supertip is a nanometric protrusion, e.g., consisting of a single atom or three atoms, that can be formed on a regular tip. For instance, on a tip apex of a paraboloid or hyperboloid base tip, a pyramidal super-tip of about 1 to 2 nm base diameter can be formed by ion-impact stimulated surface diffusion of base-tip material during annealing. Depending on operating conditions of the super-tip GFIS, ion-beam emission may be confined to the super-tip area. In a supertip, GFIS a cold finger may be used for cooling the emitter tip including the supertip. Using a supertip GFIS results typically in an improved performance, such as brightness, emission current, virtual source size. E.g. a supertip of a radius of about 1 nm formed on a regular tip can have a virtual source size of about 0.1 nm. A gas field ion source with a supertip on top of an emitter tip, e.g., a W (111) emitter tip, may be operated for instance at an angular current density of about 8 $\mu$A sr$^{-1}$ He$^+$. The current stability, at a level of about 2.5 nA, may be typically of the order of +1 or −1%.

Figure 6C:
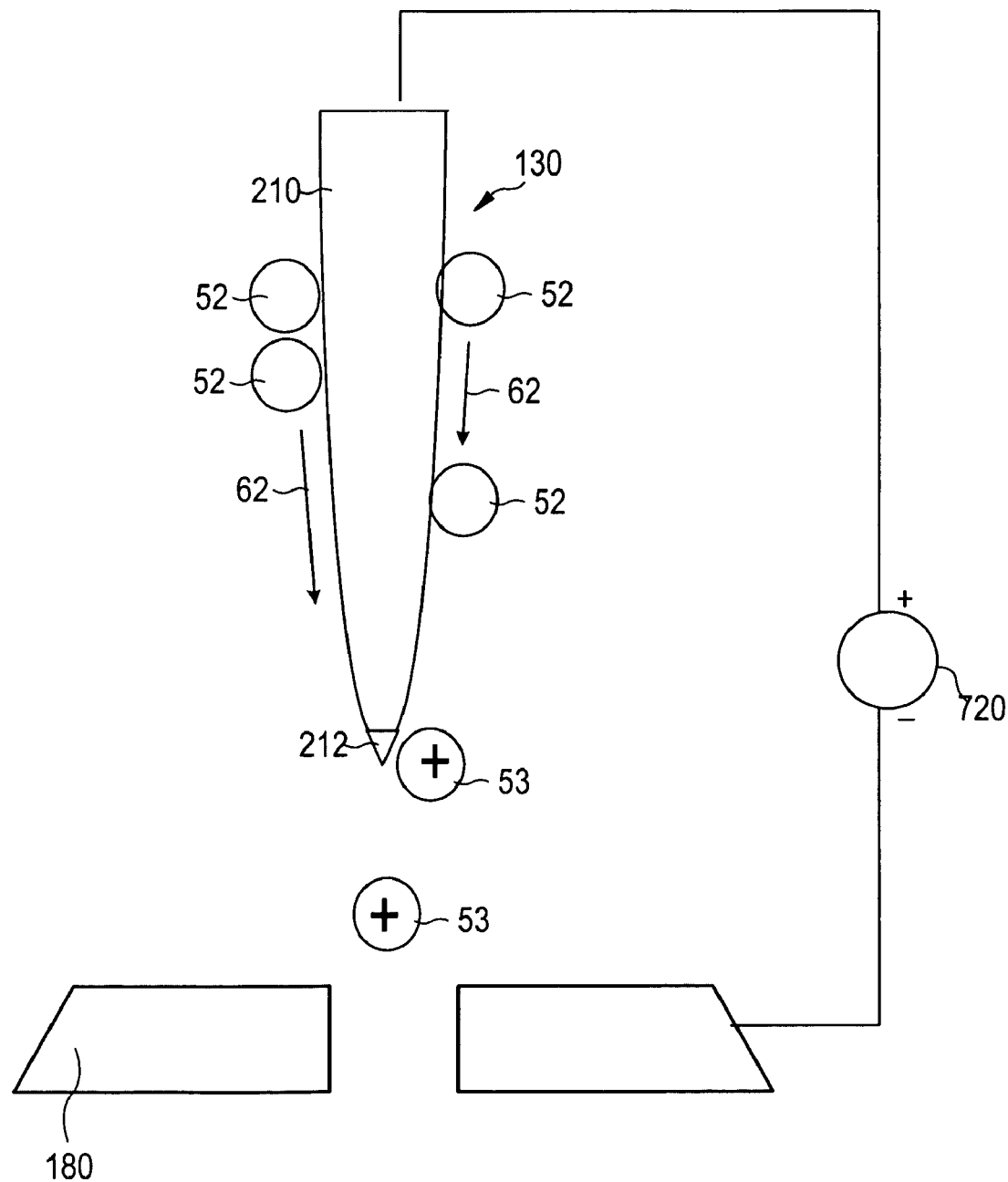
FIG. 6c shows a schematic view of an emitter tip in a gas field ion source and a principle of operation of the emitter tip according to embodiments, the emitter tip including a super-tip.

FIG. 6c shows schematically an arrangement of the emitter tip 130 including a supertip 212 and the extraction electrode 180 in a GFIS. Between the emitter tip and the extraction electrode the voltage supply 720 is provided for generating a high electric field. The emitter tip 130 includes a shank 210 and the super tip 212. According to different embodiments, the super tip 212, which is provided at the tip of the shank 210, can be a tip including one, two, three, four, five atoms or more. The operation principle of the ion generation of a gas field ion source is explained with respect to one species. As shown in FIG. 6c, for example helium atoms 52 which are ionized to generate helium ions 53 are provided.

The emitter tip 130 can typically be in communication with a cooling unit. According to different embodiments, which can be combined with any of the embodiments described herein, the cooling unit can include any of the following systems: the cooling unit maybe a cryo-cooler, EG, open or closed cycle-coolers, open or closed cycle helium coolers, open or closed cycle nitro tin coolers, a combination thereof or another cooler. Particular examples can be a pulse tube cooler or GM cooler (Gifford McMahon cooler).

If helium gas is provided to the emitter tip along a direction in FIG. 6c from top to bottom, the helium atoms 52 condense at the shank 210 of the emitter 130. Thereby, it is typically desired to have a shank 210 which provides a sufficiently large surface for condensation of the helium atoms. The surface can be in a range typically from 0.2 $\mu m^2$ to 5 $\mu m^2$.

As indicated by arrows 62 the helium atoms diffuse towards the super tip 212. Thereby, movement based on diffusion due to different helium concentration at the shank 212 with respect to the super tip 212 and based on drifts due to the electric field can result in a movement of the helium atoms 52 towards the super tip 212. As an example, helium has an ionization energy of approximately 44 V/nm. The voltage between the emitter tip 130 and the extraction electrode 180 is chosen such that the electric field at the super tip 212 provides at least the ionization energy for the species to be ionized. Thereby, it has to be considered that the electric field at the super tip is higher than at any other point of the emitter. Helium atoms 52 are thus ionized at the super tip 212 and are released as helium ions 53.

During operation of a charged particle beam apparatus, in particular of a gas field ion source, which utilizes emitter tips including ultra sharp tips or supertips, it is desired to compensate vibrations of the emitter tip, because of the very small virtual source size thereof. Vibrations of such an emitter tip of the charged particle beam apparatus, e.g., of the GFIS, may be compensated using embodiments disclosed herein.

FIG. 6a shows an embodiment of the charged particle apparatus including the charged particle optics with a single lens. Nevertheless, more than one lens can be used in the charged particle beam column without departing from the scope of the present invention. For example, a condenser lens and an objective lens may be provided. The same applies to the other charged particle optical columns described in the present application.

Figure 7:
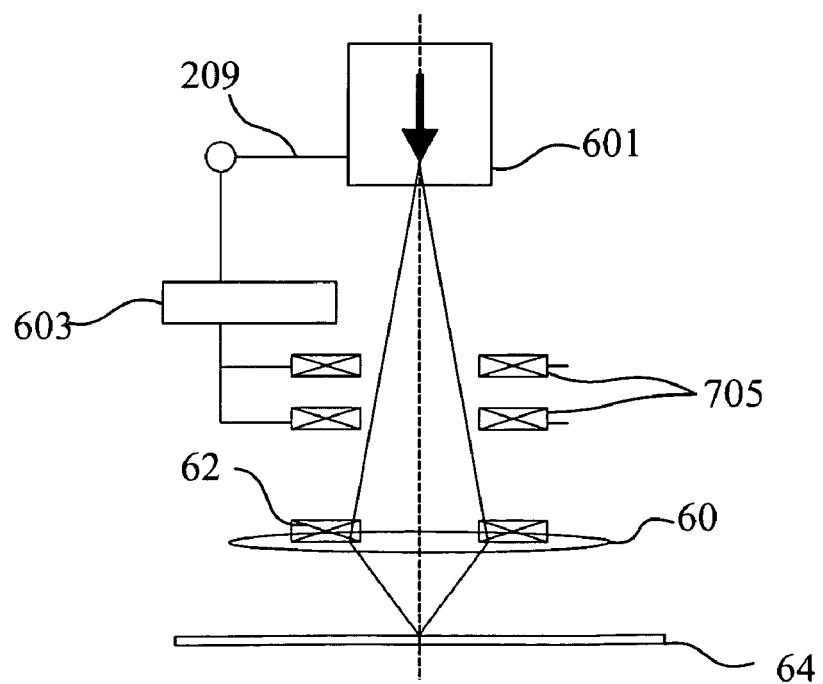
FIG. 7 shows a schematic drawing of a further embodiment of a charged particle beam apparatus including a measuring system and a vibration compensation deflector system.

FIG. 7 shows a further embodiment of the charged particle column. As compared to FIG. 6a, a two-stage correction deflection system 705 with magnetic deflectors is provided. The scan deflection system 62 is positioned to be an in-lens deflection system in order to be able to provide a reduced focal length of the objective lens.

Figure 8:
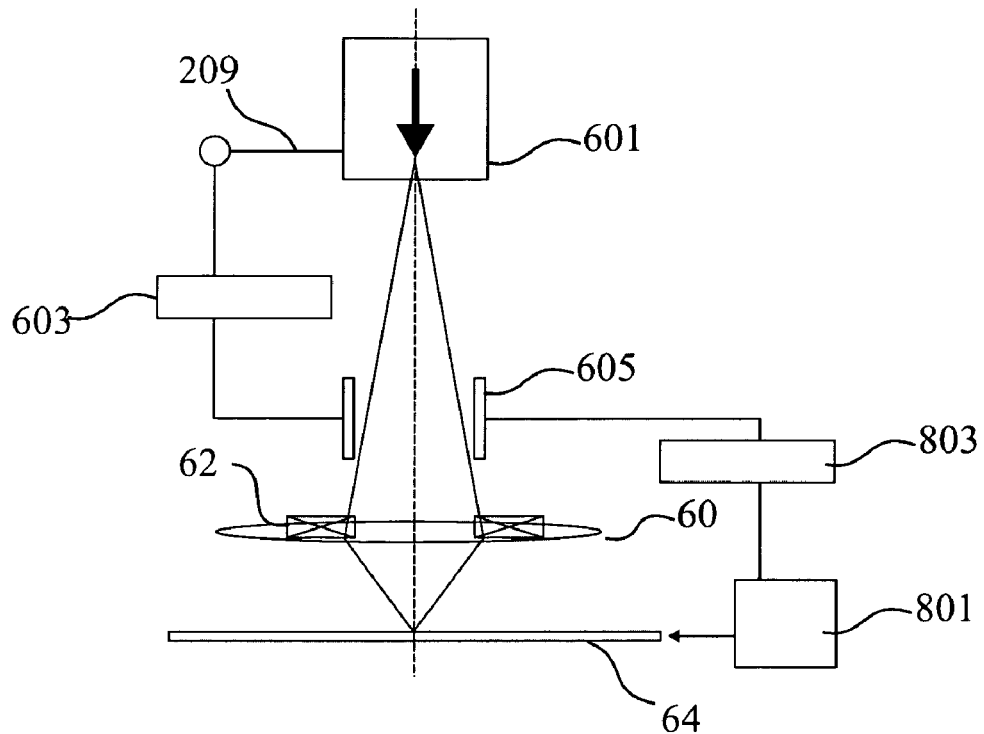
FIG. 8 shows a schematic drawing of a further embodiment of a charged particle beam apparatus including a measuring system and a vibration compensation deflector system.

A further embodiment is shown in FIG. 8. In a high-resolution system, both the source stability and the sample stability is an issue. Therefore, additionally to the above-mentioned embodiments also the sample location or the stage location, respectively, is measured by stage location-measuring system 801. The stage location-measuring system 801 may be e.g., an interferometer. For this interferometer, a laser beam would be directed onto the stage along the x-direction and along the y-direction.

According to a further embodiment, the position of the stage is optionally measured with respect to the charged particle optical system, that is the column. As mentioned above, the stage location-measuring system may include an interferometer for each of the x- and y-directions. In order to measure the position of the stage or vibrations of the stage with respect to the charged particle optical system, an interferometer with laser beam impinging on the charged particle beam column may also be applied for the x- and the y-direction. Typically, the reference laser beam for measuring the column position as a reference for the stage position is directed onto the objective lens. Thereby, the stage is measured with respect to the optical element, which usually defines the optical axis of the column.

In FIG. 8, the corresponding sample location signals (x and y), which may be indicative of a misalignment or a vibration of the stage and/or the column, are fed to a stage calibration amplifier 803 generating a correction signal. The correction signal is provided to the correction deflectors 605. The correction signal originating from the stage may be applied to the correction deflectors independently from the correction signal originating from the source. Alternatively, the correction signals of the source/tip and the sample/stage can be combined to one correction signal. The combined correction signal compensates for variations in the tip location and the sample location. The combined correction signal may then be used to control the correction deflectors 605.

Figure 12:
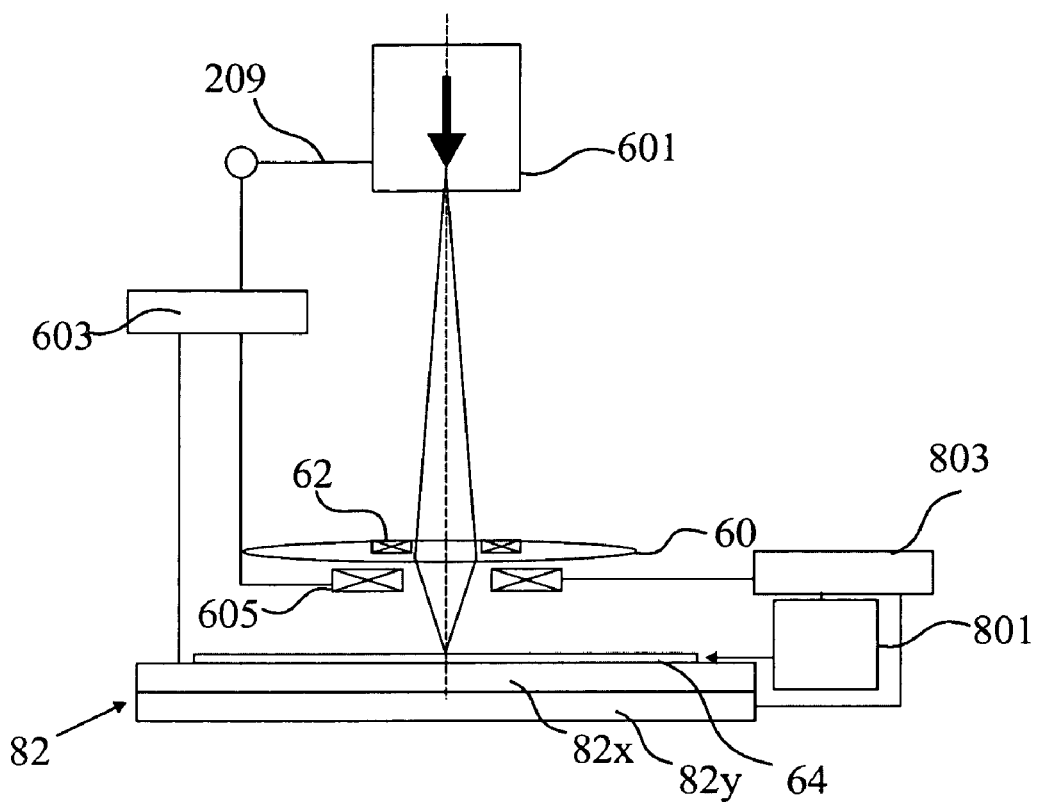
FIG. 12 shows a schematic drawing of a further embodiment of a charged particle beam apparatus including a measuring system and vibration compensation units.

Other embodiments with further compensation mechanisms are explained with respect to FIG. 12. FIG. 12 shows a charged particle beam apparatus, which emits for example electrons. However, also ions could be generated by the charged particle beam apparatus. The source arrangement 601 includes the emitter tip and the emitter location-measuring device, as described above. The emitter location-measuring device either includes one emitter location-measuring assembly for measuring variations in the location of the emitter along one direction. This may generally be the more relevant vibrational mode. Alternatively, it includes two measuring assemblies for measuring variations in the emitter location along a first direction (e.g., y-direction) and a second direction (e.g., x-direction). Yet, it may be possible that the emitter location-measuring device includes a measuring assembly capable of measuring both directions.

The charged particle beam generated by the source is focused onto specimen 64 by objective lens 60. Scan system 62, which is exemplarily shown as a magnetic deflection system including deflection coils, scans the charged particle beam over specimen 64. For the embodiments described herein, also electrostatic scan deflectors or combined magnetic-electrostatic scan deflectors may be provided in the scan system.

The emitter location signal or source location signal $S_{location}$ is fed from signal output 209 to the calibration amplifier 603 generating the correction signal $S_{correction}$ from the emitter location signal. The correction signal is provided to the correction deflectors 605.

Within FIG. 12, these deflectors of the deflector system are shown to be post-lens deflectors. The deflector system is positioned between the objective lens and the specimen or stage. Thereby, a deflection for compensating variations of the electron beam or ion beam does not have influence on the focusing properties of the column. The deflection system shown in FIG. 12 is as a magnetic single-stage deflection system. The correction deflectors in the system deflect the charged particle beam according to the correction signal, which has been generated to compensate for the measured variations of the tip/source location. Thus, the vibrations of the emitter tip can be compensated by deflecting the beam with correction deflectors 605 of a deflector system.

According to another embodiment (not shown), it is possible to provide an in-lens deflector system for compensation variations in the charged particle beam position, e.g., in the electron beam position or in the ion beam position. Thereby, the deflector system 605, which is shown in FIG. 12 as a post-lens system, would be moved up to be positioned with in the lens, particular with the active region of the lens.

According to an even further embodiment (not shown), it is possible to superpose the correction deflection with the scanning deflection of scan system 62. In the event of a magnetic deflection scan system as shown in FIG. 12, the correction signal may be added either to the scan signal or the magnetic deflectors of the scan system may be provided with additional windings in the respective coils. Thus, one coil may be provided with scan deflection windings and with correction deflection windings. In the event, the scan system is provided as an electrostatic system, the correction signal may be added to the deflection system.

Returning now to FIG. 12. Further, sample locations signals are measured with the stage location-measuring system 801. Stage location-measuring system is typically an interferometer measuring the sample position in x-y direction ad in y-direction. If a reference for the sample location is used, a reference interferometrical beam may be directed to the objective lens of the column. Sample location signals (x and y), which may be indicative of a misalignment or a vibration of the stage and/or the column, are fed to a stage calibration amplifier 803 generating a correction signal. The correction signal is provided to the correction deflectors 605.

Within FIG. 12, the emitter location calibration amplifier 603 and the stage location calibration amplifier 803 are further connected to a stage 82. Stage 82 includes positioning systems 82*x* and 82*y*. The movements of position systems 82*x* and 82*y* allow for positioning of specimen 64 in the x-y-plane.

The correction signals from the calibration amplifiers 603, 803 are provided to the stage to, thereby, also being able to compensate for variations of the emitter location and/or for variations of the sample location by movement of the stage. As explained above, it may be possible to include a piezo-system in the stage and, thereby, move the sample as required for compensating the variations of the emitter location.

Generally, a piezo table, which is capable of moving the specimen in an x-y-plane, can compensate the variation of the relative position of the charged particle beam and the specimen with high precision (nanometer-range) and in the kHz regime.

According to another embodiment, the compensation signals of the calibration amplifiers 603 and 803 may be divided into a (low frequency/constant) correction component for the stage and into a (higher frequency) correction component for the deflector system 605. If, for example, large corrections are compensated by the stage and the remaining smaller corrections are compensated by the deflector system, the field strength of the compensation deflectors can be reduced. Generally, low frequency or constant compensation signals, which can e.g., be necessary in view of a drift or the like, can be compensated for by stage movements. The deflector system may compensate with respect to compensation signals of all frequencies due to the higher bandwidth. However, a constant deflection with high field strength in the deflector system may complicate compensation with the deflector system 605. Therefore, this compensation may be swapped to other compensation means like the stage. To realize this divided compensation, it is possible to include a dividing unit for dividing the correction signal into a deflector system correction signal and a stage positioning correction signal. When a divided compensation is utilized a non-piezo, mechanical positioning system, with a resolution in the μm-range, may also be used as another alternative.

As will be understood, similar embodiments may also be provided, without a sample location calibration amplifier being involved in the compensation of the emitter vibrations. Thus, a stage positioning for compensation of variations in the location of the emitter may also be used for embodiments described with respect to FIGS. 6 and 7.

Figure 10:
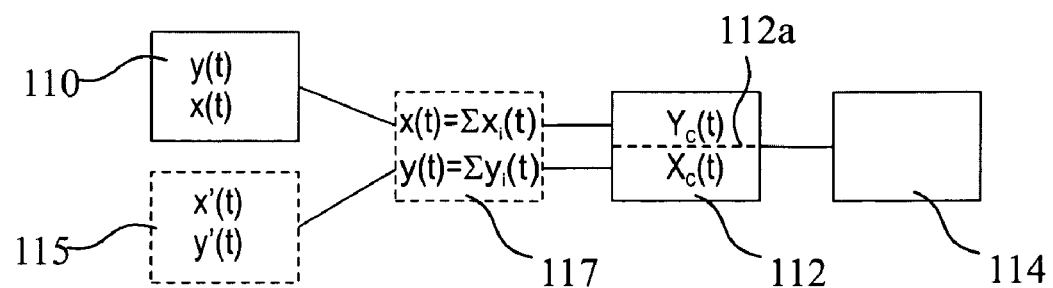
FIG. 10 shows a flow chart to explain embodiments of compensating varying locations of an emitter in a charged particle beam system.

In the following, embodiments of methods will be described with respect to FIG. 10. Thereby, dashed lines indicate optional methods. Within step 110, the location of the emitter and/or the hairpin support wire is measured. The location may be measured as a function of time for the x-direction and/or for the y-direction. Typically, the second vibrational mode shown in FIG. 9*e* is more critical. Thus, measurement of the y-direction may be sufficient. The location x(t) and y(t) may vary as a function of time t due to a drift or due to vibrations of the system.

In step 112, the location of the emitter is transformed into a correction signal. Thereby, e.g., the position of the virtual source of emission with respect to the position of measuring the location y(t) (and/or x(t)) can be taken into account. The correction signal $Y_C(t)$ (and/or $X_C(t)$) is then used to compensate for movements of the emitter tip within step 114. This is accomplished by providing the correction signals to correction deflectors.

Optionally, within step 115, also the location of the sample or the stage, respectively, is measured. The location x'(t)/y'(t) is also used to provide a correction signal to a deflector system. As indicated by dashed line 112*a*, the correction signals may be generated either independently for compensation of vibrations of the emitter and the stage, or a combined correction signal is generated. If independent correction signals are generated, the signals may then be combined before control of the correction deflectors.

Further, optionally, one of the location signals or both of the location signals may be analyzed in step 117 before calculating the correction signals. Thereby, a drift may be separated from a vibration with a certain frequency. Further, if there is more than one vibrational mode at different frequencies, these vibrational modes may also be separated. Thereby, it is possible to calculate the correction signal more precisely. For example, a drift measured at the hairpin wire may be converted to a correction signal without any magnification if the drift originates from a movement of the entire emitter source. A vibration may need to be converted with a magnification depending on the distance of the virtual emission source from the pivot point of the vibration and depending on the distance of the measurement point from the pivot point of the vibration.

The same applies to stage location measurements. There are movements or misalignment of the stage with respect to the charged particle beam column, which require a magnification factor of 1. This means, if the stage is misaligned by 20 nm, the charged particle beam is also misaligned by 20 nm. However, if e.g., the movement of the stage with respect to the column originates from a vibration of the column, a vibrational amplitude of the column in the range of about 10 nm may result in a movement of the beam on the specimen in the range of about 15 nm.

Thus, separating the measured variation of the location into different components can improve the transformation of the location signals to the correction signals.

Independent of specific embodiments, the following features may be provided independently or combined. The supporting member for supporting the emitter further may include a base and a support wire. Thereby, typically, the support wire may be a bent tungsten or tantalum hairpin wire. However, also other suitable materials may be used. Further, the supporting member may include a stabilization element. The emitter location-measuring device may be a contact-less measuring device. Typically, it may include a light source, e.g., a laser, and a detector. Yet, the detector may include at least two segments. For example, also an array with 2×2 arrays or a 64×64 array or other segmented detectors may be used. Additionally or optionally, the emitter location-measuring device may include a multi-fiber optics. Further, the emitter location-measuring device may include an interferometer. As shown above, the charged particle beam apparatus may further include a calibration amplifier for generating a correction signal provided to the deflector system, wherein the emitter correction signal is based on an emitter location signal of the emitter location-measuring device.

According to yet other embodiments, the following features may be provided independently or combined. Methods may include generating an emitter location signal; transforming the emitter location signal to a first correction signal; and providing the first correction signal to a deflector system. Methods may additionally or alternatively include generating a stage location signal; transforming the stage location signal to a second correction signal; and providing the second correction signal to a deflector system. According to yet another embodiment, the method may includes generating an emitter location signal and a stage location signal; transforming the emitter location signal and the stage location signal to a first correction signal; and providing the first correction signal to a deflector system. Additionally, it is possible that the transforming step further includes analyzing the emitter location signal and/or the stage location signal with respect to different frequencies included in the variations in locations of the emitter and/or the stage.

Having thus described the invention in detail, it should be apparent for a person skilled in the art that various modifications can be made in the present invention without departing from the spirit and scope of the following claims.

The invention claimed is:

1. A charged particle beam apparatus comprising:
    a charged particle beam source comprising:
        an emitter with an emitter tip; and
        a supporting member for supporting the emitter;
    an emitter location-measuring device for repeatedly measuring the location of the emitter; and
    at least one element selected from the group consisting of
        a deflector system adapted to compensate variations in the location of the emitter and a stage positioning system adapted to compensate variations in the location of the emitter;
    wherein the charged particle beam source is a gas field ion source and is adapted to generate at least one charged particle beam, the charged particles of the at least one charged particle beam including ions.

2. The charged particle beam apparatus according to claim 1, wherein the charged particle beam source further comprises a cooling unit adapted for cooling the emitter tip.

3. The charged particle beam apparatus according to claim 1, wherein the emitter tip is selected from the group consisting of an ultra sharp tip and an emitter tip on which a supertip is provided.

4. The charged particle beam apparatus according to claim 1, wherein:
    the supporting member for supporting the emitter further comprises at least one element selected from a base combined with a support wire, and a stabilization element.

5. The charged particle beam apparatus according to claim 4, wherein the support wire is a bent hairpin wire.

6. The charged particle beam apparatus according to claim 1, wherein the emitter location-measuring device is adapted to measure variations selected from the group consisting of: variations in the location of the emitter along a first direction, the emitter location-measuring device comprising a first measuring assembly, and variations in the location of the emitter along a first direction and along a second direction essentially perpendicular to the first direction, the emitter location-measuring device comprising a first measuring assembly and a second measuring assembly.

7. The charged particle beam apparatus according to claim 1, wherein the emitter location-measuring device is a contact-less measuring device.

8. The charged particle beam apparatus according to claim 1, wherein the emitter location-measuring device comprises a light source and a detector.

9. The method according to claim 8, wherein the light source is a laser and the detector comprises at least two segments.

10. The charged particle beam apparatus according to claim 1, wherein the emitter location-measuring device comprises at least one element selected from the group consisting of a multi-fiber optics and an interferometer.

11. The charged particle beam apparatus according to claim 1, wherein the deflector system is a post-lens deflector system.

12. The charged particle beam apparatus according to claim 1, further comprising at least one element selected from the group consisting of a scan unit, and an emitter location calibration amplifier for generating an emitter correction signal provided to the deflector system, wherein the emitter correction signal is based on an emitter location signal of the emitter location-measuring device.

13. The charged particle beam apparatus according to claim 1, further comprising at least one element selected from the group consisting of:
    a stage location-measuring device and a stage location calibration amplifier for generating a stage location correction signal provided to the deflector system, wherein the stage location correction signal is based on a stage location signal of the stage location-measuring device.

14. The method according to claim 13, wherein the stage location-measuring device is an interferometer.

15. The charged particle beam apparatus according to claim 13, wherein a combined correction signal is provided to the deflector system and wherein the combined correction signal is based on a stage location signal of the stage location-measuring device and an emitter location signal of the emitter location-measuring device.

16. The charged particle beam apparatus according to claim 1, the charged particle beam apparatus comprising a deflector system adapted to compensate variations in the location of the emitter and a stage positioning system adapted to compensate variations in the location of the emitter, and further comprising dividing means for dividing a correction signal into a deflector system correction signal provided to the deflector system and a stage positioning correction signal provided to the stage position system.

17. A method of compensating variations in an emitter location of a charged particle beam apparatus, comprising:
    measuring the emitter location of a charged particle beam emitter; and
    compensating variations in the emitter location, wherein the charged particle beam emitter is provided in a charged particle beam source, the charged particle beam source being a gas field ion source and generating at least one charged particle beam, the charged particles of the at least one charged particle beam including ions.

18. The method according to claim 17, wherein the charged particle beam emitter comprises an emitter tip, the method further comprising cooling the emitter tip.

19. The method according to claim 17, wherein the charged particle beam emitter comprises an emitter tip selected from the group consisting of an ultra sharp tip and an emitter tip on which a supertip is provided.

20. The method according to claim 17, further comprising:
measuring a stage location of a stage for supporting a specimen;
compensating variations in the stage location.

21. The method according to claim 17, wherein the compensating is conducted by deflecting the charged particle beam generated by the charged particle beam emitter.

22. The method according to claim 17, wherein a stage for supporting a specimen is provided, and wherein the compensating is conducted by moving the stage.

23. The method according to claim 17, further comprising:
generating an emitter location signal;
transforming the emitter location signal to a correction signal; and
providing the correction signal to a deflector system.

24. The method according to claim 23, wherein the transforming comprises analyzing the emitter location signal with respect to different frequencies included in the variations in locations of the emitter.

25. The method according to claim 20, further comprising:
generating a stage location signal;
transforming the stage location signal to a correction signal; and
providing the correction signal to a deflector system.

26. The method according to claim 20, further comprising:
generating an emitter location signal and a stage location signal;
transforming the emitter location signal and the stage location signal to a correction signal; and
providing the correction signal to a deflector system.

27. The method according to claim 25, wherein the transforming comprises analyzing the stage location signal with respect to different frequencies included in the variations in locations of the stage.

28. The method according to claim 26, wherein the transforming comprises analyzing the emitter location signal and the stage location signal with respect to different frequencies included in the variations in locations of the emitter and the stage.

* * * * *